(12) United States Patent
Priel et al.

(10) Patent No.: US 9,651,618 B2
(45) Date of Patent: May 16, 2017

(54) ELECTRONIC DEVICE AND METHOD FOR STATE RETENTION

(71) Applicants: Michael Priel, Netanya (IL); Leonid Fleshel, Hertzelia (IL); Dan Kuzmin, Givat Shmuel (IL)

(72) Inventors: Michael Priel, Netanya (IL); Leonid Fleshel, Hertzelia (IL); Dan Kuzmin, Givat Shmuel (IL)

(73) Assignee: NXP USA, Inc., Austin, TX (US)

( * ) Notice: Subject to any disclaimer, the term of this patent is extended or adjusted under 35 U.S.C. 154(b) by 24 days.

(21) Appl. No.: 14/655,057

(22) PCT Filed: Jan. 9, 2013

(86) PCT No.: PCT/IB2013/050178
§ 371 (c)(1),
(2) Date: Jun. 24, 2015

(87) PCT Pub. No.: WO2014/108740
PCT Pub. Date: Jul. 17, 2014

(65) Prior Publication Data
US 2015/0346277 A1  Dec. 3, 2015

(51) Int. Cl.
*G01R 31/3177* (2006.01)
*G06F 3/06* (2006.01)
(Continued)

(52) U.S. Cl.
CPC . *G01R 31/3177* (2013.01); *G01R 31/318533* (2013.01); *G01R 31/318536* (2013.01);
(Continued)

(58) Field of Classification Search
CPC ........ G01R 31/3177; G01R 31/318536; G01R 31/318575; G01R 31/318555;
(Continued)

(56) References Cited

U.S. PATENT DOCUMENTS 5,781,718 A * 7/1998 Nguyen ......... G01R 31/318547
714/33
6,370,664 B1  4/2002 Bhawmik
(Continued)

OTHER PUBLICATIONS

International Search Report and Written Opinion correlating to PCT/IB2013/050178 issued on Sep. 26, 2013.

*Primary Examiner* — John J Tabone, Jr.

(57) ABSTRACT

An electronic device may include a set of two or more scan chains and a buffer chain. Each of the scan chains includes a sequence of stateful elements connected in series, and each of the scan chains is arranged to hold a string having a length identical to the length of the respective scan chain. The strings of the scan chains are shifted in parallel from the scan chains into the memory unit and back from the memory unit into the respective scan chains. The store operation and the restore operation each include at least N0 elementary downstream shift operations. The set of scan chains includes a short chain and a detour chain, and the short chain has a length N1 which is shorter than N0. The set of scan chains further includes a buffer chain. The output end of the short chain is coupled to an input end of the buffer chain. The buffer chain is provided at least partly by the detour chain.

20 Claims, 6 Drawing Sheets

(51) Int. Cl.
*G06F 11/14* (2006.01)
*G06F 9/38* (2006.01)
*G06F 1/32* (2006.01)
*G01R 31/3185* (2006.01)
*G06F 13/14* (2006.01)
*G06F 13/38* (2006.01)
*G11C 7/10* (2006.01)
*G11C 19/28* (2006.01)

(52) U.S. Cl.
CPC ........ *G01R 31/318555* (2013.01); *G01R 31/318558* (2013.01); *G01R 31/318575* (2013.01); *G06F 1/3243* (2013.01); *G06F 1/3275* (2013.01); *G06F 3/064* (2013.01); *G06F 3/0625* (2013.01); *G06F 3/0653* (2013.01); *G06F 9/3869* (2013.01); *G06F 11/1402* (2013.01); *G06F 13/14* (2013.01); *G06F 13/38* (2013.01); *G11C 7/1036* (2013.01); *G11C 19/28* (2013.01)

(58) Field of Classification Search
CPC .... G01R 31/318533; G01R 31/318558; G06F 3/0625; G06F 3/064; G06F 3/0653; G06F 11/1402; G06F 1/3243; G06F 1/3275; G06F 9/3869; G06F 13/14; G06F 13/38; H03K 19/0016; H03K 17/24; H03K 19/173; H03K 21/403; H03K 3/356008; H03K 5/135; G11C 29/32; G11C 29/26
USPC ......... 714/719, 727, 726, 729; 365/227, 228
See application file for complete search history.

(56) References Cited

U.S. PATENT DOCUMENTS

| | | | |
|---|---|---|---|
| 6,848,067 | B2 | 1/2005 | Perner |
| 7,010,735 | B2 | 3/2006 | Motika et al. |
| 7,376,039 | B2 | 5/2008 | Choi et al. |
| 7,392,447 | B2 | 6/2008 | Tang et al. |
| 7,412,672 | B1* | 8/2008 | Wang ............... G01R 31/3177 716/106 |
| 2004/0081208 | A1 | 4/2004 | Tseng |
| 2004/0085818 | A1* | 5/2004 | Lynch ............... G06F 13/1673 365/189.02 |
| 2005/0185479 | A1* | 8/2005 | Berthold ............ G11C 29/46 365/189.12 |
| 2012/0151288 | A1 | 6/2012 | Maloney et al. |

* cited by examiner

ELECTRONIC DEVICE AND METHOD FOR STATE RETENTION

FIELD OF THE INVENTION

This invention relates to an electronic device and a method for state retention.

BACKGROUND OF THE INVENTION

State retention power gating (SRPG) is a technique for managing power in electronic devices. SRPG allows to gate supply power and thereby save leakage power. The logic state of a module may be saved before the module is powered off. When the module is powered on again, the saved state may be restored.

The state of a module may be the logic state of a set of stateful elements. The stateful elements may, for example, be registers or flip-flops. Several stateful elements may be connected in series to form a scan chain. When the module to about to be powered off, the individual states of the stateful elements of the scan chain may be shifted through the scan chain and into a memory unit where they may be stored while the module is powered off.

A module may comprise more than only one scan chain. The scan chains may have the same lengths. This can be advantageous because it allows the scan chains to be operated in a synchronized manner. For various reasons, however, the scan chains in an electronic device may have different lengths. For example, one or more scan chains may be shorter than the others. In this case, dummy clock cycles or dummy stateful elements may be introduced in order to operate the scan chains in parallel. Dummy cycles may, however, complicate the clock tree design, whereas adding dummy stateful elements may cost area on a chip.

SUMMARY OF THE INVENTION

The present invention provides an electronic device and a method for state retention as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
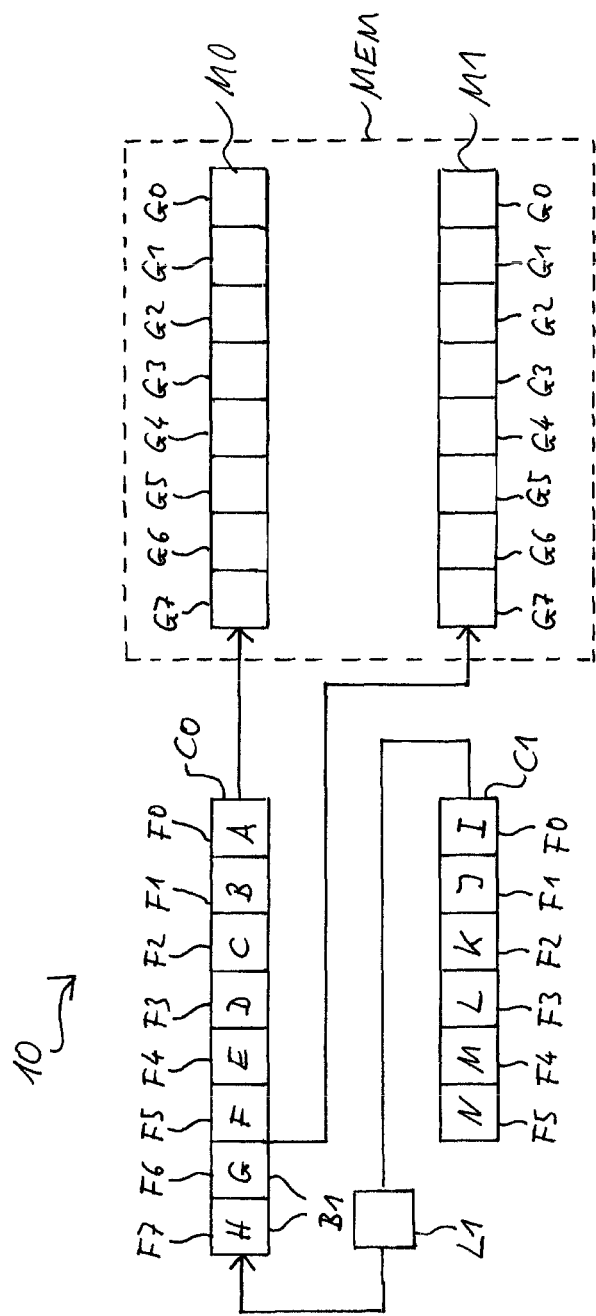
FIGS. 1, 2, and 3 schematically show a first example of an embodiment of an electronic device.

The example of an electronic device 10 shown in FIG. 1 comprises a first scan chain C0 and a second scan chain C1. The second scan chain C1 may be shorter than the first scan chain C0. Each of the scan chains C0 and C1 may comprise a set of stateful elements connected to each other in series in a downstream direction to form the respective scan chain C0 and C1. These stateful elements may be referred to as the chain elements. For example, the first scan chain C0 may comprise a total of N0 chain elements F0 to F7, while the second scan chain may comprise, for example, a total of N1 stateful elements. In the shown example, the first scan chain C0 has the length N0=8 and comprises the 8 chain elements F0 to F7, while the second scan chain has the length N1=6 and comprises the 6 chain elements F0 to F5. The stateful elements may, for example, be registers or flip-flops. Each stateful element may be arranged to hold one character. A character is a data item consisting of a fixed number of bits. For example, in an example in which the stateful elements are flip-flops, a character is one bit. Each scan chain C0 and C1 may thus hold a string of N0 and N1 characters, respectively. In the shown example, the scan chains C0 and C1 are holding the strings ABCDEFGH and IJKLMN, respectively. A string is a finite sequence of characters. In an example in which a character is a bit, a string is a binary sequence. In this case, each of the mentioned characters A to N may be either 1 or 0.

A downstream direction is a direction of data flow. For example, still considering the example of FIG. 1, data may enter the first scan chain C0 at stateful element S7, travel via the stateful elements S6 to S0 and leave the scan chain C0 at the stateful element S0. The same applies analogously to the second scan chain C1. In the figures, the direction of data flow may be indicated by an arrow.

The stateful elements of the scan chains C0 and C1 may be powered on when the electronic device 10 is in an operating mode and be powered off in a power saving mode. The electronic device 10 may comprise or be connectable to a memory unit MEM for storing the strings held by the scan chains C0 and C1, i.e., for saving the states of the stateful elements of the scan chains C0 and C1.

The electronic device 10 may comprise further scan chains similar to either scan chain C1 or C0 and which are not shown in FIG. 1.

In the shown example, the string ABCDEFGH residing in the first scan chain C0 may be transferred to the memory unit MEM in a straightforward manner by shifting it forward, i.e., in the downstream direction, in accordance with, e.g., a clock signal. It may take N0 clock cycles to transfer the N0 characters in the first scan chain C0 to the memory unit MEM. Transferring the data content of the first scan chain C0, e.g., the string ABCDEFGH, to the memory unit MEM and restoring it on the first scan chain C0 at a later point in time may take a total of two times N0 clock cycles. In contrast, a similar straightforward transfer of data from the shorter scan chain 1 to the memory unit MEM would require fewer clock cycles.

In FIG. 1, the memory unit MEM is represented by a first memory chain M0 and a second memory chain M1. In practice, the memory unit MEM may have a hardware structure different from the one shown in the figures. The actual memory unit MEM and the one shown in FIG. 1 may, however, be equivalent and exchangeable.

In the example shown, the electronic device 10 further comprises a buffer B1 through which the string residing in the second scan chain C1 may be passed in order to route the string into the memory unit MEM, e.g., into the second memory chain M1. The buffer chain B1 may have a length of K=N0−N1. In the figure, N0=8, N1=6, and K=2. The buffer chain B1 has the effect of increasing the number of elementary shift operations or clock cycles for storing the string of the scan chain C1 by K (e.g., 2) elementary shift operations or clock cycles. The first scan chain C0 and the second scan chain C1 may thus be operated in a synchronous manner for storing and restoring the respective strings.

Referring now summarily to FIGS. 1 to 6, the electronic device 10 may comprise a set of two or more scan chains, e.g. the scan chains C0, C1, and C2. It may further comprise a memory unit MEM, or it may be arranged to be connected thereto. Each of the scan chains, e.g., C0, C1, and C2, may have an input end and an output end which are opposite ends of the respective scan chain. Each of the scan chains C0, C1, C2 may comprise a sequence of stateful elements, e.g. F0, F1, F2, etc, which may be connected in series between the input end and the output end. Each scan chain may be arranged to hold a string, e.g., ABCDEFGH and IJKLMN. The strings may have a length identical to the length of the respective scan chain C0; C1. The length of a scan chain may be defined as the number of stateful elements of the chain.

Figure 6:
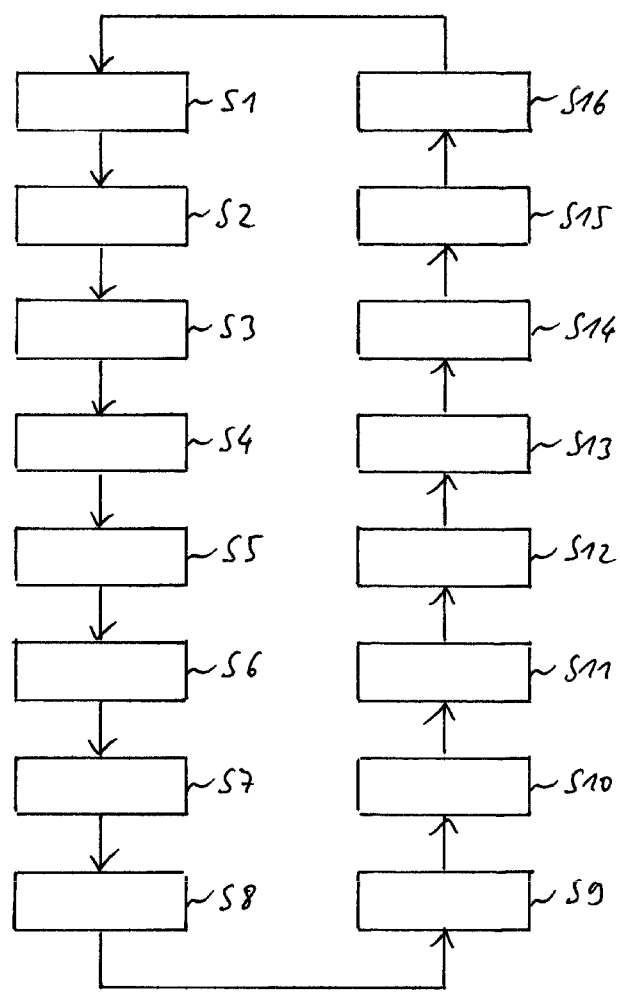
FIG. 6 shows a flow chart of an example of a method of operating an electronic device.

The electronic device 10 may be arranged to shift the strings of the scan chains C0, C1 in parallel from the scan chains, e.g., C0 and C1, into the memory unit MEM via the respective output ends in a store operation (e.g., steps S1 to S8 in FIG. 6) and back from the memory unit MEM into the respective scan chains, e.g., C0 and C1, via the respective input ends in a restore operation (e.g., steps S9 to S16 in FIG. 6). The store operation and the restore operation may each comprise, for example, at least N0 elementary downstream shift operations (e.g., steps S1 to S8 in FIG. 6).

Figure 3:
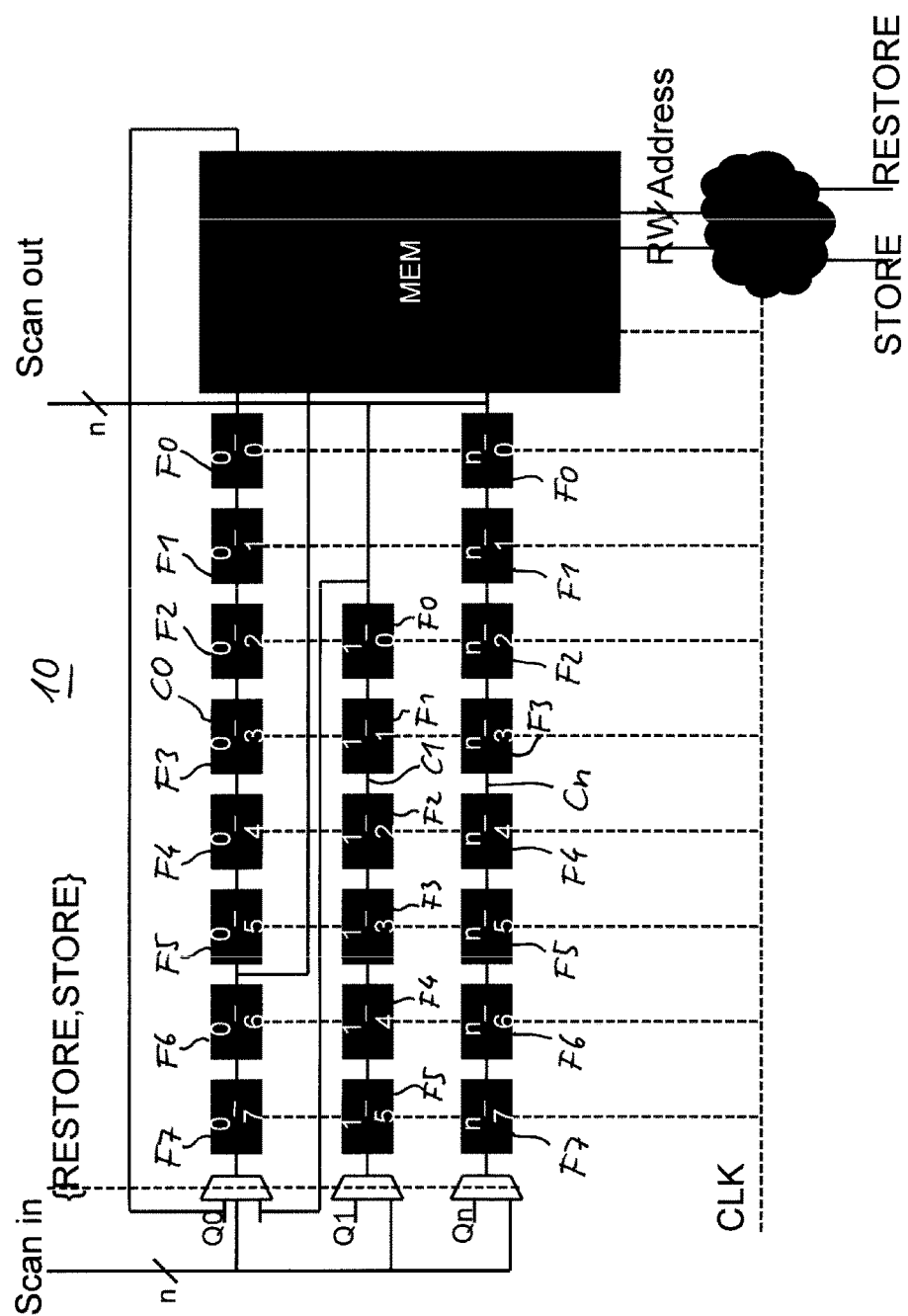
Figure 4:
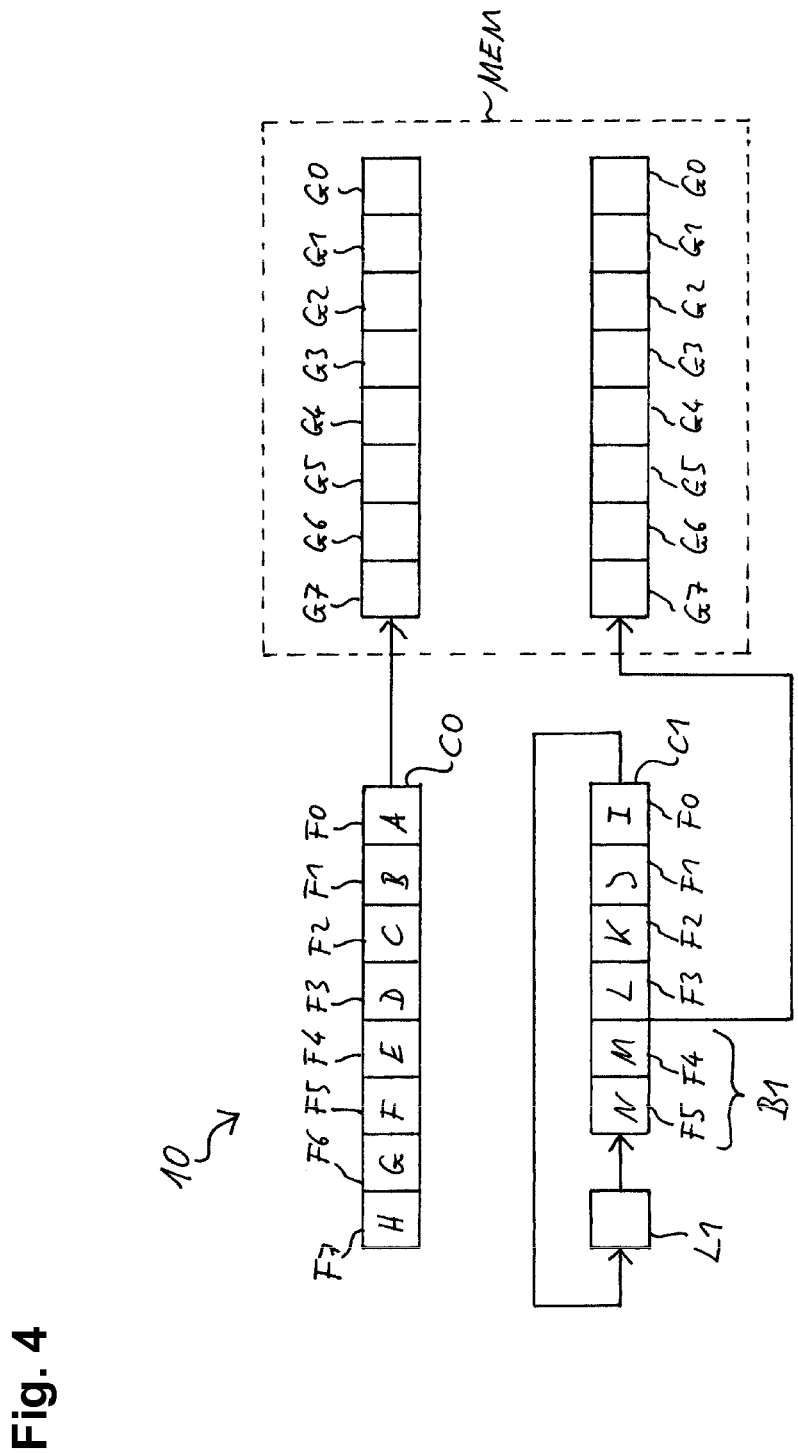
FIGS. 4 and 5 schematically show a second example of an embodiment of an electronic device.
Figure 5:
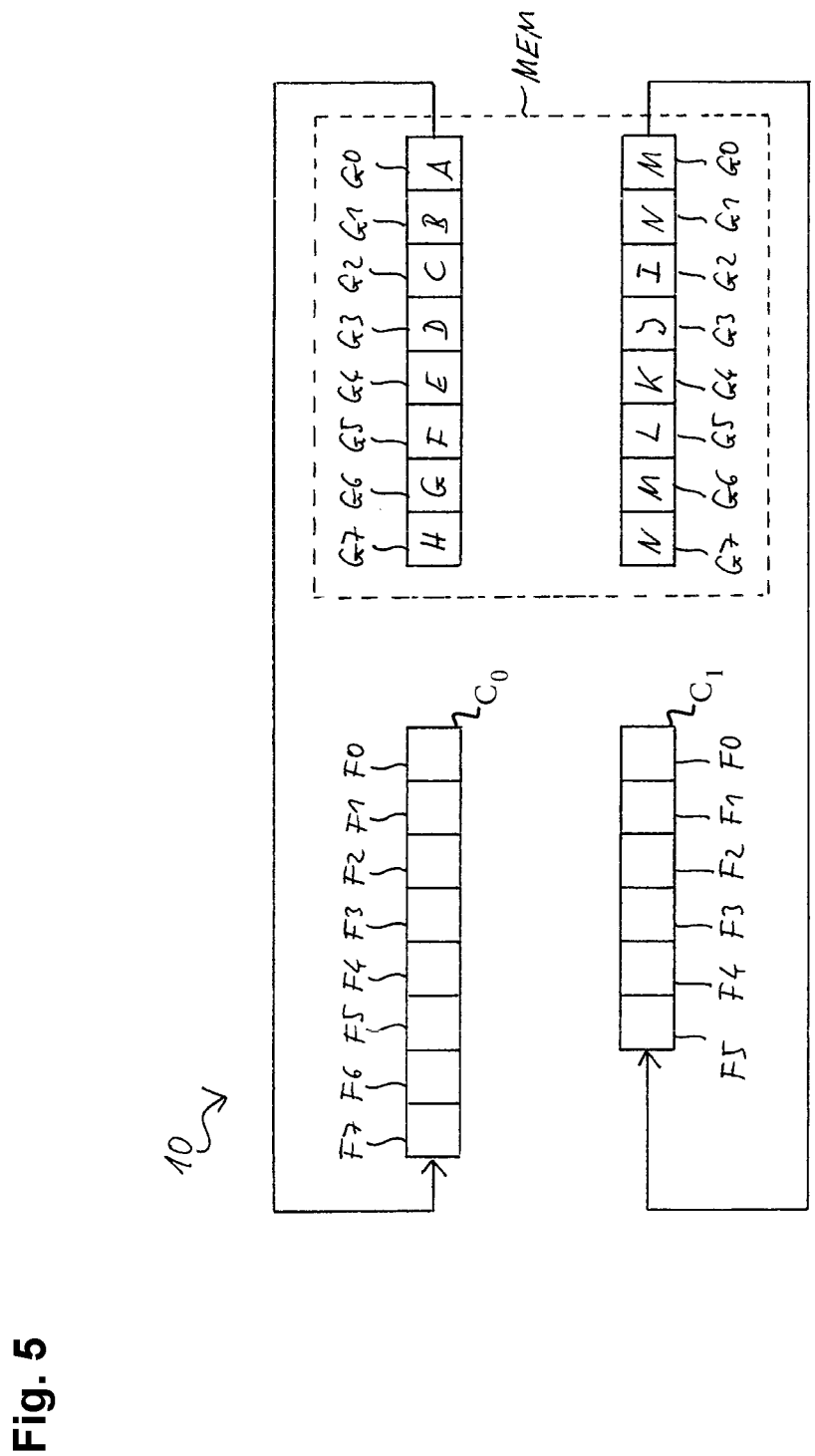

The set of scan chains may notably include a short chain (C1 in the example) and a detour chain (C0 in the example of FIG. 4; C0 in the example of FIGS. 1 to 3). The expression "short chain" is used herein as a name of the scan chain in question. It does not imply that the scan chain is "short" in any sense.

The short chain C1 may have a length N1 shorter than N0. This difference may be compensated by the buffer chain B1. The buffer chain B1 may have a length of, e.g., K=N0−N1. The combined length of the short chain C1 and the buffer chain B1 may thus be identical to, e.g., the length N0 of the scan chain or, e.g., the number of elementary shift operations of the store operation. The buffer chain B1 may be a FIFO buffer. Accordingly, it may have an input end and an output end, which are opposite ends of the buffer chain B1. The output end of the short chain C0 may be connected to or connectable to the input end of the buffer chain B1 while the output end of the buffer chain B1 may be connected to or connectable to the memory unit MEM.

Figure 2:
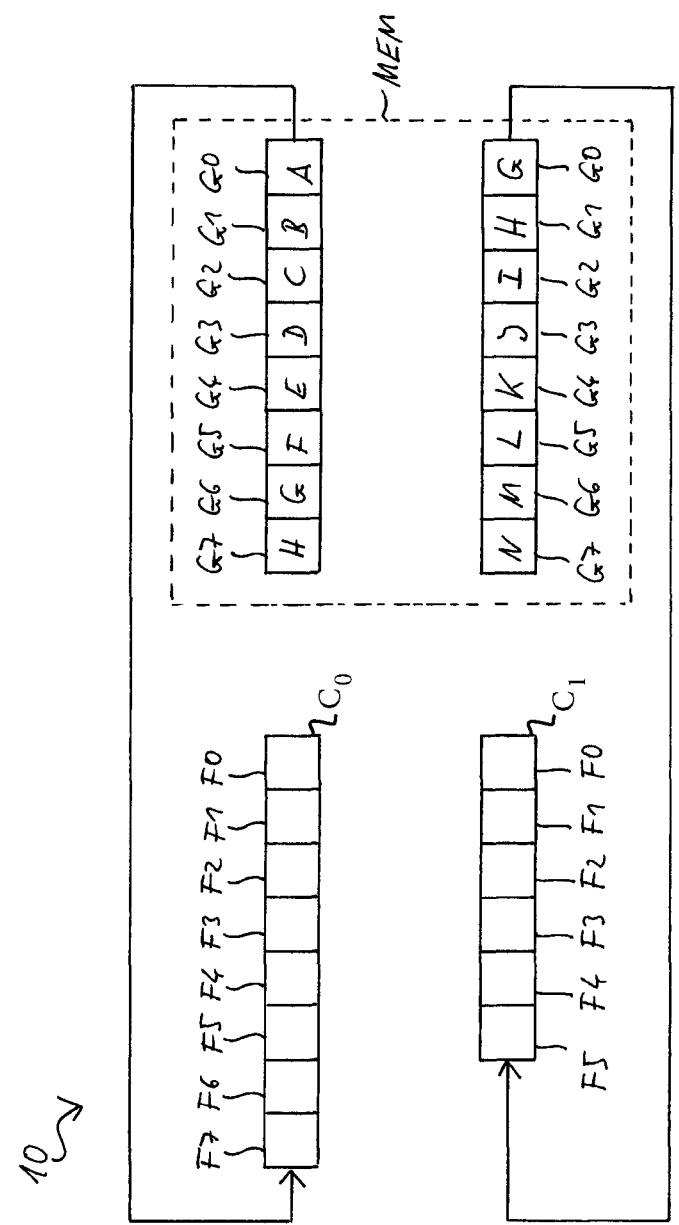

The buffer chain B1 may notably be provided at least partly by the detour chain (C0 in FIGS. 1 to 3; C1 in FIG. 4). At least one chain element of the detour chain may thus be used not only for storing and transferring the string which is usually stored in the detour chain, but also as a detour for the string that is stored in the short chain, e.g., the scan chain C1, to compensate for the "missing" chain elements of the short chain and to enable synchronous operation of the various scan chains of the electronic device 10.

As mentioned above, the detour chain may be the short chain (e.g., C1, see FIG. 4). This design may be particularly simple, as it does not necessarily involve any connecting lines between the short chain and the other scan chains.

Alternatively, the detour chain may be a scan chain C0 other than the short chain. This solution may be particularly suited in a device 10 in which the short chain (e.g., C1) is too short to provide a sufficiently long buffer chain.

As shown in FIGS. 1 to 4, the buffer chain B1 may comprise the input end (e.g., the input of the stateful element F7 in FIGS. 1 to 3 or F5 in FIG. 4) of the detour chain (e.g., C0 or C1). This may prevent relevant data in the detour chain from being overwritten with data from the short chain. For example, the input end of the buffer chain B1 may be the input end, e.g., F7 or F5, of the detour chain, e.g., C0 or C1. A branch from the detour chain, e.g., C0 or C1, may connect the output end of the buffer chain B1 to the memory unit MEM.

The electronic device 10 may, for example, be arranged to perform the elementary downstream shift operations, e.g., steps S1 to S16 (see FIG. 6) successively in accordance with a clock signal CLK. In other words, the various scan chains may thus be clocked by the same clock signal, facilitating the layout of the device. Furthermore, the memory unit MEM may be arranged to receive a set of characters from the scan chains in parallel and to store this set of characters under a single address. In the shown example in which the store operation comprises eight elementary shift operations, the entire content of several scan chains, may be stored using only eight addresses.

The device 10 may deenergize the scan chains after the store operation. It may reenergize them prior to the restore operation.

Referring now specifically to FIGS. 1 and 4, the output end of the short chain, e.g., C1, may be connected to the input end of the buffer chain B1 via a lock-up latch L1. It is noted that the clock signals of different chains may be insufficiently balanced. The lockup latch may resolve a possible race issue.

A method of operating the electronic device 10 may comprise:

shifting the strings of the scan chains in parallel from the scan chains into the memory unit MEM via the respective output ends in a store operation, e.g., S1 to S8 (see FIG. 6), and back from the memory unit MEM into the respective scan chains via the respective input ends in a restore operation, e.g., steps S9 to S16 (see FIG. 6). The store operation and the restore operation may each comprise at least N0 elementary downstream shift operations.

As described above, the set of scan chains may include a short chain (e.g., the scan chain C1) and a buffer chain connected between the short chain and the memory unit. The buffer chain may notably be part of the short chain itself, as shown in FIG. 4.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the memory chains M0 and M1 shown in FIGS. 1 and 3 may be replaced by a more complex memory architecture, notably an address based memory architecture.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the scan chains C0, C1, . . . , Cn and the memory unit MEM may be implemented in a single integrated circuit. Alternatively, the examples may be implemented as any number of separate integrated circuits or separate devices interconnected with each other in a suitable manner. For example, the memory unit MEM may be located on a separate device.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electronic device comprising:
a set of two or more scan chains; and
a buffer chain, wherein:
each of the scan chains has an input end and an output end, which are opposite ends of the respective scan chain, and each of the scan chains comprises a sequence of stateful elements connected in series between the input end and the output end, and each of the scan chains is arranged to hold a string having a length identical to a length of the respective scan chain,
the electronic device is arranged to shift the strings of the scan chains in parallel from the scan chains into a memory unit via the respective output ends in a store operation and back from the memory unit into the respective scan chains via the respective input ends in a restore operation, wherein the store operation and the restore operation each comprise at least $N_0$ elementary downstream shift operations,
the set of scan chains includes a long chain, a short chain and a detour chain, wherein the long chain has a length $N_0$, the short chain has a length $N_1$, where $N_1$ is shorter than $N_0$, and
the buffer chain has a length of $K=N_0-N_1$, and has an input end and an output end, which are opposite ends of the buffer chain, with the output end of the short chain coupled to the input end of the buffer chain, the buffer chain is provided at least partly by the detour chain, the buffer chain comprises the input end of the detour chain and the input end of the buffer chain is the input end of the detour chain, wherein the electronic device further comprises a branch from the detour chain coupling the output end of the buffer chain to the memory unit.

2. The electronic device of claim 1, wherein the detour chain is the short chain.

3. The electronic device of claim 1, wherein the detour chain is a scan chain other than the short chain.

4. The electronic device of claim 1, arranged to perform the elementary downstream shift operations successively in accordance with a clock signal.

5. The electronic device of claim 1, wherein the stateful elements are registers or flip-flops.

6. The electronic device of claim 1, wherein the memory unit is arranged to receive a set of characters from the scan chains in parallel and to store this set of characters under a single address.

7. The electronic device of claim 1, arranged to deenergize the scan chains after the store operation and to reenergize the scan chains prior to the restore operation.

8. The electronic device of claim 1, wherein the output end of the short chain is coupled to the input end of the buffer chain via a lock-up latch.

9. The electronic device of claim 1, wherein the store operation and the restore operation each comprise exactly $N_0$ elementary downstream shift operations.

10. The electronic device of claim 1, wherein the electronic device includes the memory unit.

11. The electronic device of claim 10, wherein the output end of the buffer chain is coupled to the memory unit.

12. An electronic device comprising:
a set of scan chains including a long chain, a short chain and a detour chain, wherein each of the scan chains has an input end and an output end, which are opposite ends of the respective scan chain, and each of the scan chains comprises a sequence of stateful elements connected in series between the input end and the output end, and each of the scan chains is arranged to hold a string having a length identical to a length of the respective scan chain, and wherein the long chain has a length $N_0$ and the short chain has a length $N_1$, where $N_1$ is shorter than $N_0$;
a buffer chain, wherein the buffer chain has a length of $K=N_0-N_1$, and has an input end and an output end, which are opposite ends of the buffer chain, with the output end of the short chain coupled to the input end of the buffer chain, the buffer chain forms a portion of the detour chain, the buffer chain comprises the input end of the detour chain and the input end of the buffer chain is the input end of the detour chain, and wherein the long chain subsumes the detour chain and comprises the buffer chain; and
a branch from the detour chain coupling the output end of the buffer chain to a memory unit.

13. The electronic device of claim 12, wherein the stateful elements are registers or flip-flops.

14. The electronic device of claim 12, wherein the output end of the short chain is coupled to the input end of the buffer chain via a lock-up latch.

15. The electronic device of claim 12, wherein the electronic device is arranged to shift the strings of the scan chains in parallel from the scan chains into the memory unit via the respective output ends in a store operation and back from the memory unit into the respective scan chains via the respective input ends in a restore operation, wherein the store operation and the restore operation each comprise at least $N_0$ elementary downstream shift operations.

16. The electronic device of claim 15, arranged to perform the elementary downstream shift operations successively in accordance with a clock signal.

17. An electronic device comprising:
a set of scan chains including a long chain, a short chain and a detour chain, wherein each of the scan chains has an input end and an output end, which are opposite ends of the respective scan chain, and each of the scan chains comprises a sequence of stateful elements connected in series between the input end and the output end, and each of the scan chains is arranged to hold a string having a length identical to a length of the respective scan chain, and wherein the long chain has a length $N_0$ and the short chain has a length $N_1$, where $N_1$ is shorter than $N_0$;
a buffer chain, wherein the buffer chain has a length of $K=N_0-N_1$, and has an input end and an output end, which are opposite ends of the buffer chain, with the output end of the short chain coupled to the input end of the buffer chain, the buffer chain forms a portion of the detour chain, the buffer chain comprises the input end of the detour chain and the input end of the buffer chain is the input end of the detour chain, and wherein the short chain subsumes the detour chain and comprises the buffer chain; and
a branch from the detour chain coupling the output end of the buffer chain to a memory unit.

18. The electronic device of claim 17, wherein the stateful elements are registers or flip-flops.

19. The electronic device of claim 17, wherein the output end of the short chain is coupled to the input end of the buffer chain via a lock-up latch.

20. The electronic device of claim 17, wherein the electronic device is arranged to shift the strings of the scan chains in parallel from the scan chains into the memory unit via the respective output ends in a store operation and back from the memory unit into the respective scan chains via the respective input ends in a restore operation, wherein the store operation and the restore operation each comprise at least $N_0$ elementary downstream shift operations.

* * * * *